United States Patent
Zhang et al.

(10) Patent No.: US 6,683,480 B2
(45) Date of Patent: *Jan. 27, 2004

(54) DESIGNS OF INTEGRATED CIRCUITS FOR HIGH-SPEED SIGNALS AND METHODS THEREFOR

(76) Inventors: Minghao (Mary) Zhang, 20975 Valley Green Dr., Suite 293, Cupertino, CA (US) 95014; John C. Tung, 20975 Valley Green Dr., Suite 293, Cupertino, CA (US) 95014

(*) Notice: Subject to any disclaimer, the term of this patent is extended or adjusted under 35 U.S.C. 154(b) by 0 days.

This patent is subject to a terminal disclaimer.

(21) Appl. No.: 10/325,038

(22) Filed: Dec. 20, 2002

(65) Prior Publication Data

US 2003/0189449 A1 Oct. 9, 2003

Related U.S. Application Data

(63) Continuation-in-part of application No. 10/137,988, filed on May 2, 2002, now Pat. No. 6,559,693, and a continuation-in-part of application No. 10/118,733, filed on Apr. 8, 2002, now Pat. No. 6,559,693, and a continuation-in-part of application No. 09/947,643, filed on Sep. 5, 2001, now Pat. No. 6,433,595.

(51) Int. Cl.[7] .............................................. H03K 21/00
(52) U.S. Cl. ........................................ 327/115; 327/218
(58) Field of Search .......................... 327/113–115, 117, 327/200, 201, 208, 210–215, 218, 219

(56) References Cited

U.S. PATENT DOCUMENTS 5,844,437 A * 12/1998 Asazawa et al. ............ 327/202

* cited by examiner

Primary Examiner—My-Trang Nuton
(74) Attorney, Agent, or Firm—Joe Zheng

(57) ABSTRACT

It is well known that the parasitic effects in individual components can introduce artifacts into signals when the frequency of the signals exceeds a certain range. Techniques are described to utilize the parasitic effects in favor to the signals by systematically adjusting the components such that the artifacts are minimized. According to one embodiment, a parameter defined as an Electrically Equivalent Geometry or EEG is defined as a function of width and length that confines one part of a transistor controlling how much current can go through. A proper adjustment of the EEG for each of the transistors in a differential amplifier or circuit can reduce the parasitic effects that can cause the artifacts to the signal but also form inherently resonant filtering functions that minimize harmonic components in the output signals.

18 Claims, 9 Drawing Sheets

DESIGNS OF INTEGRATED CIRCUITS FOR HIGH-SPEED SIGNALS AND METHODS THEREFOR

CROSS-REFERENCE TO RELATED APPLICATION

This application is a continuation-in-part of U.S. Application Ser. No. 10/118,733, filed Apr. 8, 2002, now U.S. Pat. No. 6,556,056, and U.S. patent application Ser. No. 10/137,988, filed May 2, 2002, now U.S. Pat. No. 6,559,693, and U.S. patent application Ser. No. 09/947,643, filed Sep. 5, 2001, now U.S. Pat. No. 6,433,595, all of which are incorporated herein for all purposes.

BACKGROUND OF THE INVENTION

1. Field of the Invention

The invention is generally related to the area of integrated circuits designs, and more particularly, related to improved designs of integrated circuits for high-speed signals and methods therefor.

2. The Background of Related Art

The future communication networks demand ever increasing bandwidths and flexibility to different communication protocols. Fiber optic networks are becoming increasingly popular for data transmission due to their high speed and high capacity capabilities. Wavelength division multiplexing (WDM) is a technology that puts data from different sources together on an optical fiber with each signal carried at the same time on its own separate light wavelength. Using the WDM system, up to 80 or more separate wavelengths or channels of data can be multiplexed into a light stream transmitted on a single optical fiber. The inherent optical data rate from a modulated single-mode laser beam traveling through an optical fiber is expected to well exceed 1000 Gbit/sec.

Currently, the practically realizable bandwidth of fiber optical communication systems has been limited by signal conversions between optical and electrical domains and associated electronics hardware. A major component used in the current optical communication systems (e.g., Synchronous Optical Network) is an optical transceiver, a combination of transmitter/receiver in a single package. An optical transceiver can be found in every interface such as a source, a destination or a key interface along an optical network. Besides the applications in optical communications, there are other applications or systems that also use transceivers for receiving or transmitting high-speed data, such as wireless communications devices.

Current transceivers for high-speed signals are built using Silicon Germanium (SiGe), Gallium Arsenide (GaAs), and Indium Phosphorous (InP) processes that have been proved very expensive by current technologies. It is well known that the cost of the processes simply does not make economic sense to implement the transceivers on a large scale. Thus, there is a great need for better designs that can build the transceivers more economically.

SUMMARY OF THE INVENTION

This section as well as the abstract of the present invention is for the purpose of summarizing some aspects of the present invention and to briefly introduce one or more preferred embodiments. Simplifications or omissions may be made to avoid obscuring the purpose of the section and the abstract. Such simplifications or omissions are not intended to limit the scope of the present invention.

The present invention pertains to integrated designs of differential amplifiers that can be used in many electronic circuits and system. It is well known that the parasitic effects in individual components (e.g., transistors and resistors) will introduce artifacts into signals when the frequency of the signals exceeds a certain range. One of the purposes in the present invention is to utilize the parasitic effects in favor to the signals by systematically adjusting the components such that the artifacts are minimized.

According to one aspect of the present invention, a parameter defined as an Electrically Equivalent Geometry or EEG is defined as a function of width and length that confines one part of a transistor controlling how much current can go through. For example, from a layout perspective, an EEG pertains to a physical area of a gate of a MOSFET transistor or to a physical area of an emitter of a bipolar transistor. A proper adjustment of the EEG for each of the transistors in a differential amplifier or circuit can reduce the parasitic effects that can cause the artifacts to the signal but also form inherently resonant filtering functions that minimize harmonic components in the output signals.

To further reduce the parasitic effects that can cause the artifacts to the signal or form proper resonant filtering functions, other individual components, such as resistors, are systematically adjusted. Each of the components is associated with a parameter referred to as an Electrically Equivalent Component Parameter (EECP) that is also inherently a function of a width and a length that define a semiconductor area to make the component. A proper adjustment of EECP for the components, together with the adjusted EEG of the transistors, not only can higher signal speed be accommodated but also the output signals of higher quality can be produced.

To further increase the ability of a differential amplifier or circuit to accommodate even higher signal speed, inductive components (e.g., inductors and transformers) are introduced and systematically adjusted. Inductances from the inductive components can thus further reduce the parasitic effects that can cause the artifacts to the signal or form more proper resonant filtering functions to enhance the signals, resulting in a differential amplifier or circuit with the ability of accommodating even higher signal speed.

There are many benefits, advantages and features in the present invention. One of them is to enable a differential amplifier or circuit to accommodate high signal speed that could not be accommodated in a differential amplifier or circuit that is otherwise designed with the prior art methodology. In essence, the present invention makes it possible to implement high speed systems, such as optical or wireless communications on a large scale with cost-effective semiconductor process (e.g., 0.18μm with complementary metal-oxide semiconductor).

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENT

The present invention pertains to integrated designs of differential amplifiers that can be used in many electronic circuits and system. It is well known that the parasitic effects in individual components (e.g., transistors and resistors) will introduce artifacts into signals when the frequency of the signals exceeds a certain range. One of the purposes in the present invention is to utilize the parasitic effects in favor to the signals by systematically adjusting the components such that the artifacts are minimized.

The detailed description of the present invention is presented largely in terms of procedures, steps, logic blocks, processing, or other symbolic representations that directly or indirectly resemble the operations of optical devices or systems coupled to optical networks. These process descriptions and representations are typically used by those skilled in the art to most effectively convey the substance of their work to others skilled in the art. Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 1A:
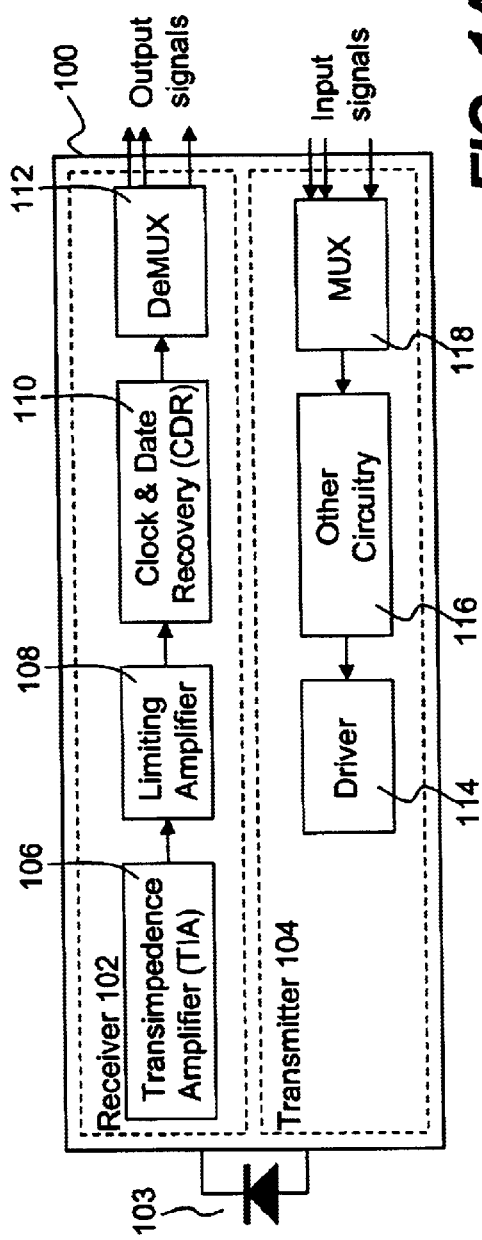
FIG. 1A illustrates an exemplary transceiver that can be used in an optical network.

Referring now to the drawings, in which like numerals refer to like parts throughout the several views. FIG. 1A illustrates an exemplary transceiver 100 that can be used in an optical network. The transceiver 100 includes two functional blocks, a receiver 102 and a transmitter 104. The receiver 102. receives an electronic signal converted from optical signals impinged upon a light-to-electric converter 103 (e.g., a photodiode). The electrical signal is amplified in a transimpedance amplifier (TIA) 106 and further amplified in a limiting amplifier 108 for a proper signal range. Following the limiting amplifier 108 is a clock and data recovery (CDR) circuit 110 that includes a phase-locked-loop (PLL), not shown. The amplified signal from the limiting amplifier 108 is thus locked and the data in the electrical signal and the clock information therein are recovered. A DeMUX 112 is used to demultiplex the data to support multiple channels, such as OC-3(155 Mbits/s), OC-12(622 Mbits/s), and OC-48(2,488 Mbits/s). On the other side, the transmitter 104 includes a MUX 118 that multiplexes signals from a plurality of channels to produce a signal that may go through other circuits 116 before reaching a driver 114 to feed the signal to a electric-to-optical converter 103 (e.g., a laser generator).

Figure 1B:
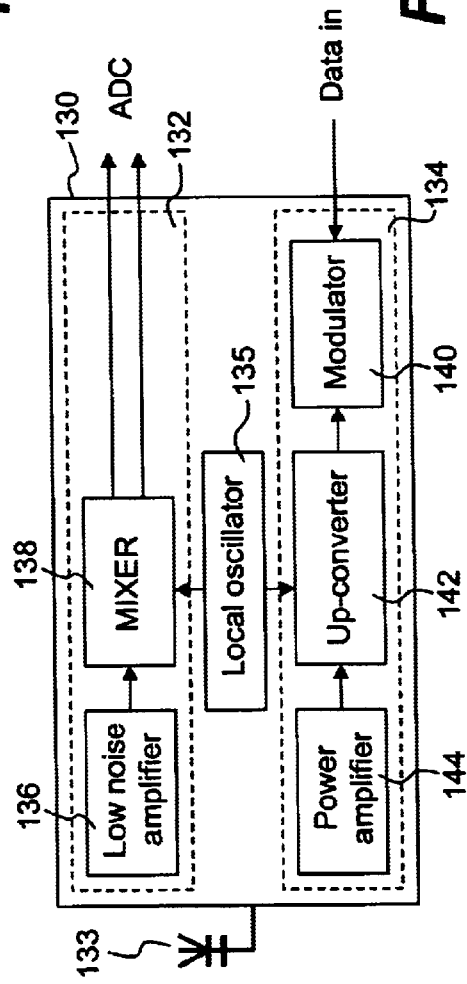
FIG. 1B shows an exemplary transceiver that can be used in a wireless communication device.

FIG. 1B shows an exemplary transceiver 130 that can be used in a wireless communication device. The transceiver 130 also includes two functional blocks, a receiver 132 and a transmitter 134. The receiver 132 receives an electronic signal from an antenna 133. The electric signal is then amplified in a low noise amplifier 136 to a certain magnitude. The amplified signal is then mixed with an oscillating signal from an oscillator 135 in a mixer 138 that subsequently outputs one or more signals suitable for a subsequent analog-to-digital process. In one application, the mixer 138 functions as a down-converter receiving a 4.9 GHz signal from the oscillator 135. On the other end, the transmitter 134 receives data and modulates the data in a modulator 140. The modulated signal is up-converted in a converter 142 in accordance with an oscillating signal from the oscillator 135 and further amplified in a power amplifier 144 before reaching the antenna 133 for transmission.

Without further listing other applications or systems that also use transceivers, the capacity of the transceiver in FIG. 1A or FIG. 1B to process the signals going through in terms of speed has a great impact in the communication capability in an optical network or a wireless communication device. To ensure a transceiver capable of processing high-speed signals (e.g., 40 GHz or 100 Mbits/second), each of the functional blocks in the transceiver must be designed to handle the signal speed without introducing artifacts to the signals.

Many of the functional or building blocks are now using differential inputs to enhance performance. Often, amplification, impedance matching, filtering, and level shifting circuitry are required in front of an analog-to-digital conversion and use one or more differential amplifiers or circuits. It is understood that fully differential circuits are not only ideal for these requirements but also greatly simplify the design task. In addition, the high degree to which the characteristics of like components on the same substrate can be matched led to extensive use of symmetry as a filtering mechanism. The differential amplifier circuit configuration in particular assumes considerable prominence in this respect.

Figure 2:
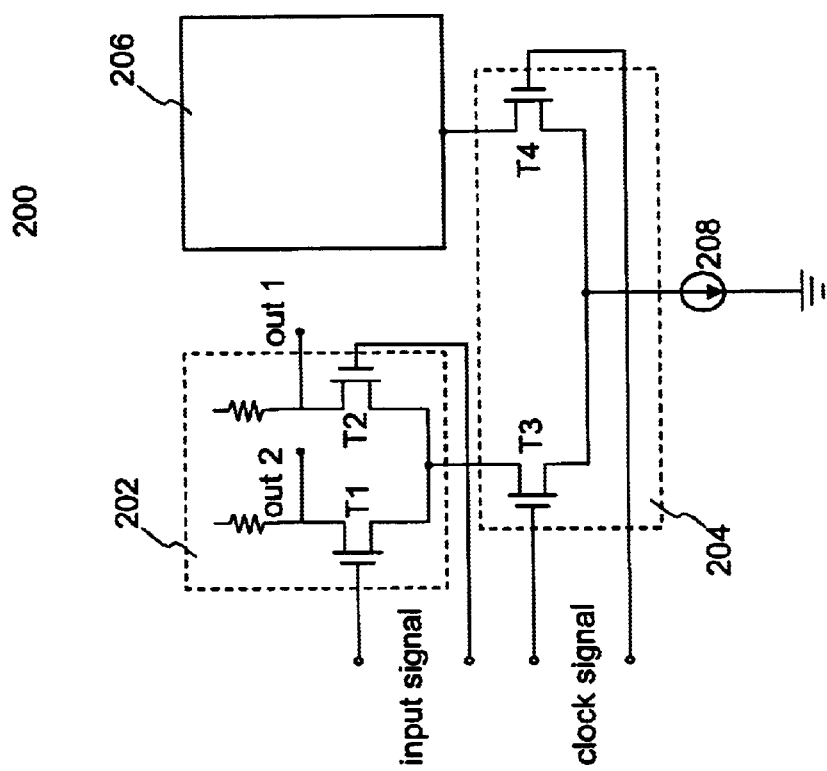
FIG. 2 shows a circuit that includes three differential amplifiers coupled in a way commonly seen in functional blocks to build up a transceiver or other circuits.

Referring now to FIG. 2, there shows a differential circuit 200 that includes three differential amplifiers 202, 204 and 206 (the detail of the differential amplifier 206 is not shown) coupled in a way commonly seen in functional blocks to build up a transceiver or other functional circuits. It is assumed that a current source 208 provides a current I and generally desired and understood to those skilled in the art that a half of the current I will drive each of the amplifiers 202 or 206, thus ½ I going through each of the transistors T3 and T4. As far as the amplifier 202 is concerned, it is driven by a ½ I current (from the amplifier 204) and thus ¼ I current goes through each of the transistors T1 and T2. In prior art designs, the transistors T1 or T2 and T3 or T4 are commonly designed in proportion to the current going through.

However, as the speed of the signal going through the circuit 200 increases, the parasitic effects start to play roles that can severely distort the signal, thus limiting the speed the circuit 200 could process or accommodate if the circuit 200 is designed and implemented with the commonly used methodology.

Significantly apart from the prior art methodology, the present invention discloses the use and adjustments of the parasitic effects and techniques of creating resonant effects so as provide filtering functions to "combat" the artifacts that are otherwise introduced by the parasitic effects due to the high speed of the signal. According to one aspect of the present invention, various transistors are respectively adjusted to increase/decrease, relatively, corresponding parasitic capacitances so that the parasitic effects and resonant effects for inherent filtering are effectively and favorably used. According to another aspect of the present invention, a number of inductors are introduced to further reduce those parasitic effects that can cause the artifacts and form more proper resonant effects so that additional higher speed capability can be reached.

There are two major types of transistors: the bipolar junction transistors and the field-effect transistors or FET. A bipolar transistor is based on two p-n junctions, either as an n-p-n or a p-n-p triple layer, which constitute the emitter, base and collector. The main conventional current flow is from the collector to the emitter, and it depends not only on the potential difference applied from the collector to the emitter but also (more sensitively at the normal operating point) on the current flowing through the base.

There is a class of FET transistors in which current flows from a source to a drain via a channel whose resistance can be controlled by applying a voltage to a gate. In a junction gate FET, known as a JUGFET or JFET, this is achieved by surrounding the n-type channel with p-type material (or vice versa) connected to the gate, the width of the depletion layer controls the resistance of the channel. In an insulated gate FET, known as an IGFET, when a gate voltage above a threshold level is applied, the channel is formed in p-type material (with low doping concentration) between the highly-doped n-type source and drain regions. An IGFET is typically a metal oxide semiconductor (MOS) device, and hence is also called a MOSFET. Depending on a process, a MOSFET can also be classified as a NMOS device and a PMOS device.

To facilitate the description of the present invention, the following description is based on MOSFET devices. Those skilled in the art can appreciate that the description herein can be equally applied to other types of transistors.

Figure 3A:
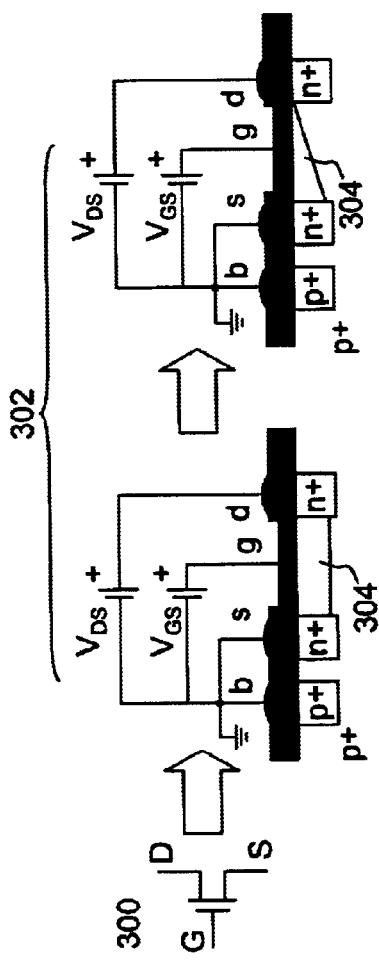
FIG. 3A shows a modeling of a MOSFET represented by a commonly used symbol that is further represented by a process model in which a current channel begins to pinch-off at a drain-end when $V_{DS}$ increases.

FIG. 3A shows a modeling of a MOSFET represented by a commonly used symbol 300 that is further represented by a process model 302 showing changes when $V_{DS}$ increases. In other words, the channel (shape) 304 begins to pinch-off at the drain-end when the voltage across the Drain and Source increases. Typically, the Gate-Source voltage is set by $V_{GS}$ and does not change with $V_{DS}$, thus as $V_{DS}$ increases, $V_{GD}$ decreases according to Gate-Drain voltage $V_{GD} = V_{GS} - V_{DS}$ and eliminates the channel 304 at Drain end if falling below a threshold.

Figure 3B:
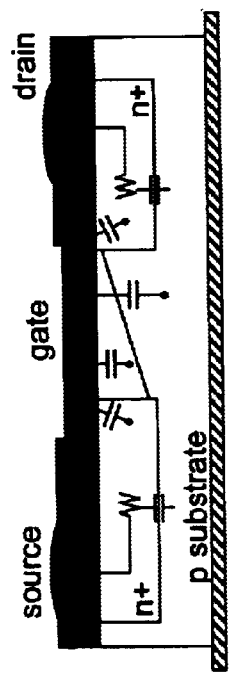
FIG. 3B shows various parasitic capacitors based on the process model of FIG. 3A.
Figure 3C:
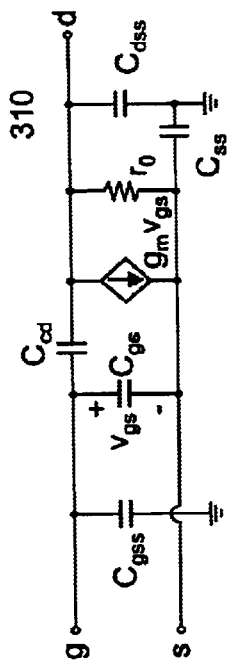
FIG. 3C illustrates an equivalent circuit model that is shown to have the potential to introduce artifacts to a signal going through the circuit when the speed of the signal is beyond a certain range.

FIG. 3B shows various parasitic capacitors based on the process model 302 of FIG. 3A. These capacitors are negligent when the signal speed is low, but become prominent when the signal speed becomes high. Essentially, the capacitors are the main cause of the parasitic effects. Although there is no clear cut at which speed or frequency these capacitors become prominent, it is well understood that the higher the signal speed is, the higher the parasitic effects become. FIG. 3C illustrates an equivalent circuit model 310 that is shown to have the potential to introduce artifacts to a signal going through the circuit when the speed of the signal is beyond a certain range.

One of the features in the present invention is to introduce additional parasitic capacitance and/or inductance that inherently adjust the overall parasitic effects caused by various parasitic capacitors shown in FIG. 3B, form various filtering functions to enhance the signal, and reduce artifacts introduced to the signal.

According to one embodiment of the present invention, the transistors in a differential amplifier or a set of differential amplifiers are respectively adjusted such that the resultant parasitic effects are used in favor to the signal. For a given wafer process, the conductance of a transistor is primarily determined by a physical area of the gate (G) in MOSFET or the emitter in Bipolar. In other words, the physical area of a certain aspect of a transistor determines its parasitic capacitances while that physical area controls the current going through the transistor.

As used herein, a parameter describing the physical area of a certain aspect of a transistor is defined as an Electrically Equivalent Geometry (EEG) which is a function of W, L, wherein W=width and L=length are used to determine the physical area of a certain aspect of a transistor. For example, from a layout perspective, an EEG pertains to a physical area of a gate of a MOSFET transistor or to a physical area of an emitter of a bipolar transistor.

Figure 3D:
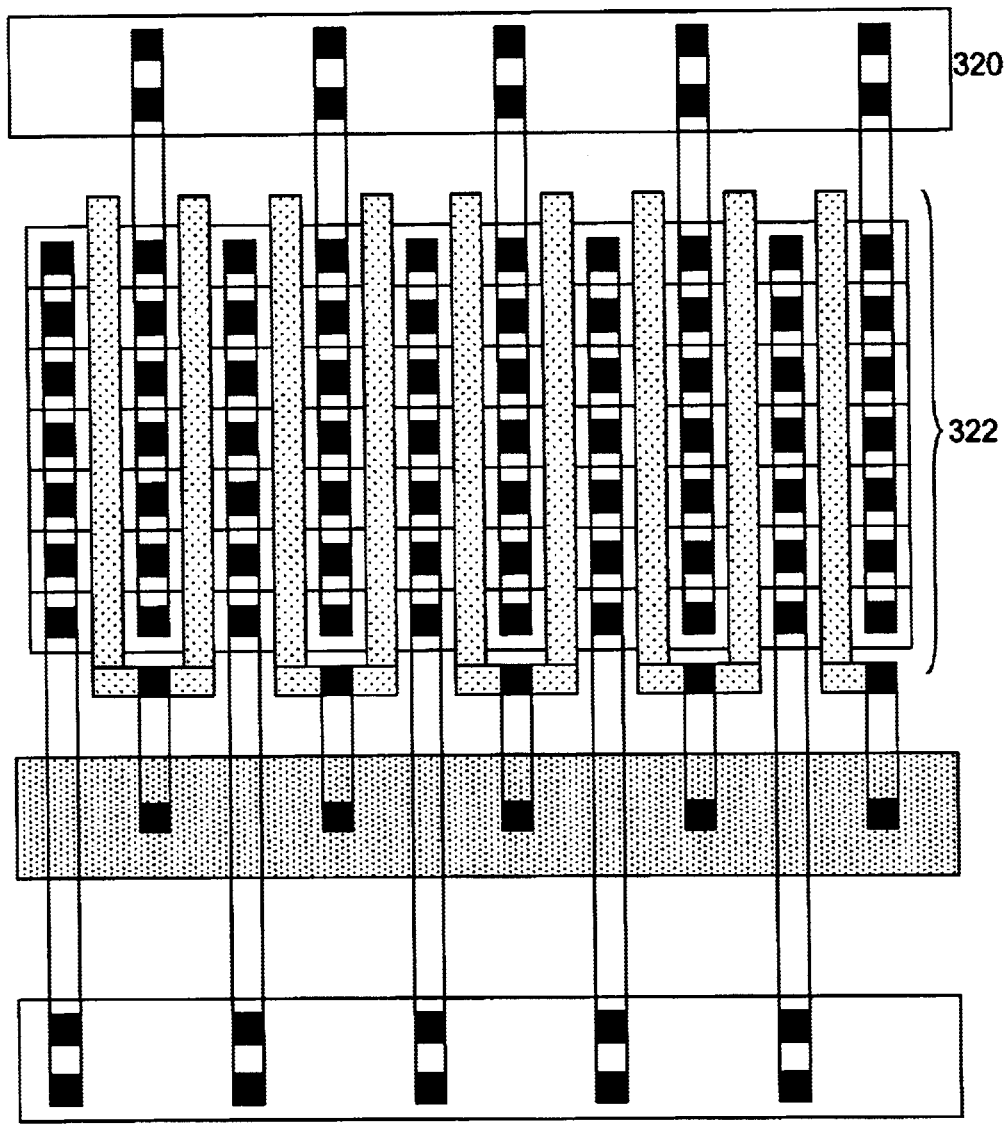
FIG. 3D shows an exemplary layout in which a MOSFET device uses nine regular MOSFET models to make up an enlarged MOSFET (essentially an "enlarged" gate) such that the EEG of the MOSFET device is nine times bigger than a regular MOSFET model.

According to one embodiment, FIG. 3D shows an exemplary layout 320 in which a MOSFET device 322 uses nine regular MOSFET models to make up an enlarged MOSFET (essentially an "enlarged" gate) such that the EEG of the MOSFET device 322 is nine times bigger than a regular MOSFET model. With the introduction of enlarged MOSFET devices in a differential amplifier or circuit, the performance of the differential amplifier or circuit yields results that can not be normally expected in the traditional designs.

To conveniently describe the functionally relevant and adjustable electrical parameters of some or all the components in a differential amplifier or a functional block within a circuit system, an Electrically Equivalent Component Parameter (EECP) is also defined as follows:

EECP of a resistor=its resistance value;

EECP of an inductive component=its inductance value;

EECP of a transformer formed with coupled inductive components=a vector quantity consisting of the individual inductance value and the coupling coefficient between the inductive components;

EECP of a capacitive component=its capacitance value; and

EECP of an transistor=its EEG.

Figure 4:
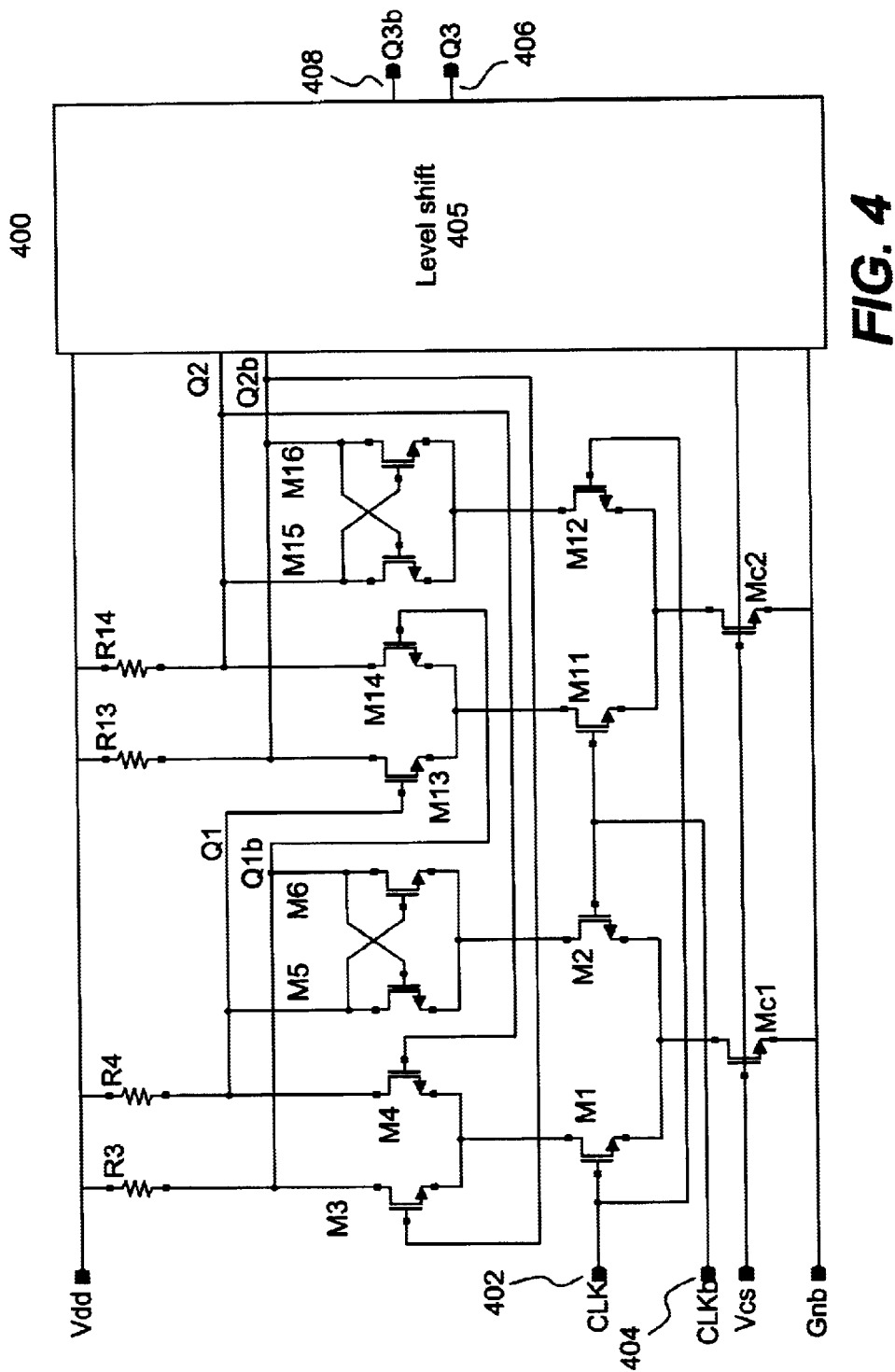
FIG. 4 shows an exemplary circuit architecture of a divide-by-2 divider employing a plurality of differential amplifiers.

With the above definitions, the present invention can be more efficiently described and appreciated by those skilled in the art. FIG. 4 shows an exemplary circuit 400 of a Divide-by-2 divider employing a plurality of differential amplifiers (e.g., M1M2, M3M4, and M5M6). Vcs is a bias voltage applied to the gates of transistors MC1 and MC2 to set up a predetermined amount of current to support the differential amplifiers. Through the divider 400, the frequency of a differential signal applied between CLK 402 and CLKb 402 will be divided in half and the resultant signals are output from Q3 406 and Q3b 408.

Figure 5A:
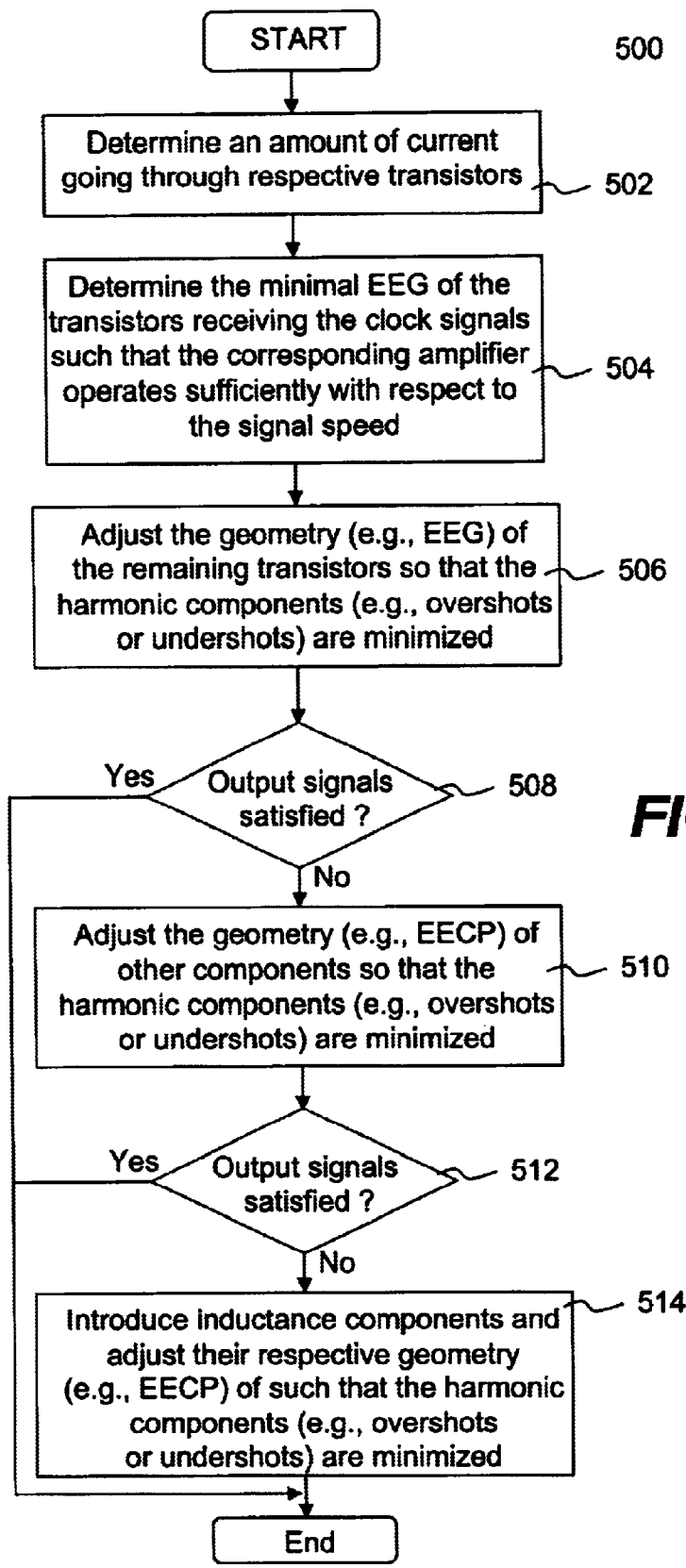
FIG. 5A shows a designing flowchart or process of differential amplifiers or circuits that can be used in the circuit architecture of FIG. 4.

According to one embodiment of the present invention, the circuit 400 or the differential amplifiers therein are designed differently from the perspective of the prior art methodology, though the circuit topology remains essentially the same. FIG. 5A shows a designing flowchart or process 500 of differential amplifiers or circuits that can be used in the circuit 400 of FIG. 4 or other building blocks. At 502, an initial amount of current that goes through each of the transistors is determined. The determination of a current through a transistor may be done in accordance with the example 200 in FIG. 2.

Figure 5B:
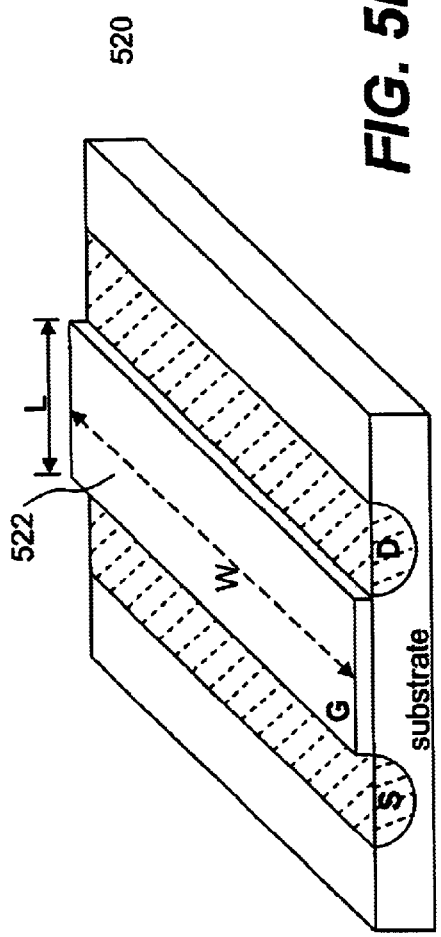
FIG. 5B shows an exemplary transistor layout that shows a gate area determined by an EEG (a function of width W and length L)

At 504, the EEG of the input transistors (e.g., T3 and T4 of FIG. 2, M1 and M2 of FIG. 4) is respectively adjusted to be close to minimal under the condition that the differential amplifier or the circuit works properly or sufficiently with respect to the frequency thereof. One of purposes here is to ensure that the parasitic effects are minimized by having "minimized" transistors. FIG. 5B shows an exemplary transistor layout 520 that shows a gate area 522 determined by an EEG (a function of width W and length L). A "minimized" transistor indicates that the value of EEG is minimized without affecting the expected current to go through the gate 522. It is understood that, when the EGG is minimized, the parasitic effects that can be caused by the transistor due to a high frequency of the signal are also minimized.

At 506, the EEG for the remaining transistors in the differential amplifier or the circuit is adjusted to minimize the harmonic components of the output signals. Significantly different from the prior art methodology that tends to minimize the parasitic effects by using "minimized" transistors, the present invention, instead, alters the ratio of the values of the EEG for the remaining transistors. For example, as far as the transistors T1 and T2 of FIG. 2 are concerned, their EEG ratio (e.g., EEG of T1 over EEG of T2) is no longer a unity. According to one embodiment, the ratio is bigger than a "norm". As shown in FIG. 5B, when the width or the length for one transistor is enlarged and for another transistor is reduced (without compromising the amount of current designed to go through), the associated parasitic capacitances are correspondingly altered. Together with the altered parasitic capacitances from other adjusted transistors, the simulations and embodiments have shown that the quality of the output signals has been considerably improved due to at least two reasons. First, the overall parasitic capacitances are adjusted in favor to the signal, wherein some of the parasitic capacitances that cause the artifacts to the signal may be reduced due to the characteristics of serial connections of some of the resultant parasitic capacitors. Second, some of the parasitic capacitors form inherent resonant circuits with other parasitic components and thus provide desired filtering functions if their values are properly adjusted.

At 508, the output signals are examined. If the output signals are considered good enough, the process 500 ends. If the output signals are considered not good enough, the process 500 continues to 510. In general, when the frequency of the signals going through the differential amplifiers designed in accordance with the present invention does not exceed a certain range, the differential amplifiers can deliver resultant signals that are of better quality than that from differential amplifiers designed in accordance with the prior methodology. When the frequency of the signals exceeds the range, additional designs are considered at 510.

Figure 5D:
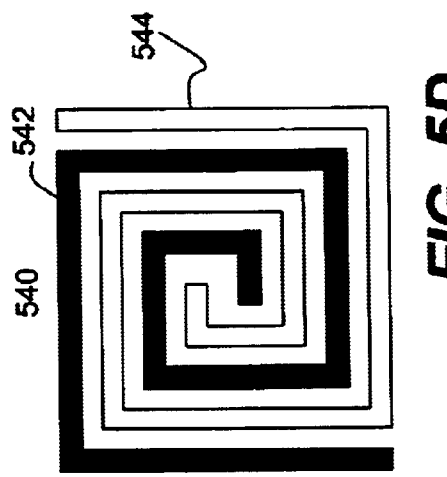
FIG. 5D shows an exemplary layout of an interwound transformer.
Figure 5C:
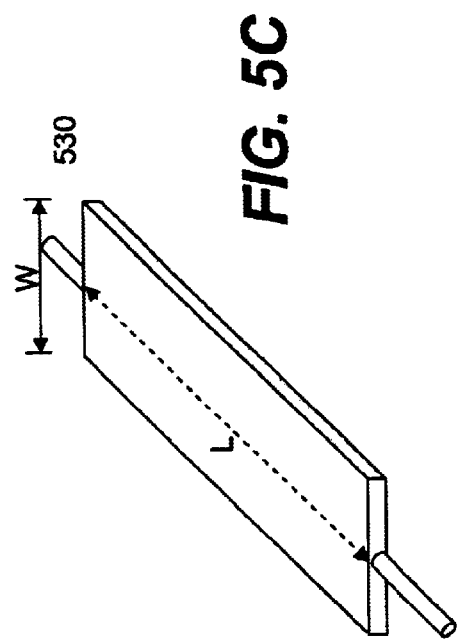
FIG. 5C shows an exemplary perspective view of a resistor layout.

At 510, the values of EECP of other components in the differential amplifier are respectively adjusted to further reduce the harmonic components in the output signals. FIG. 5C shows an exemplary perspective view of a resistor layout 530. The resistance value of the resistor is controlled by the associated EECP which is also a function of the width W and the length L. According to one embodiment, the values of EECP for the resistors are respectively adjusted to further balance the respective currents going through the corresponding transistors, resulting in different EECP for different resistors.

At 512, the output signals are examined. If the output signals are considered good enough, the process 500 ends. If the output signals are considered not good enough, the process 500 continues to 514, which indicates that the parasitic effects are significant possibly due to the magnitude of the signal speed.

Figure 6:
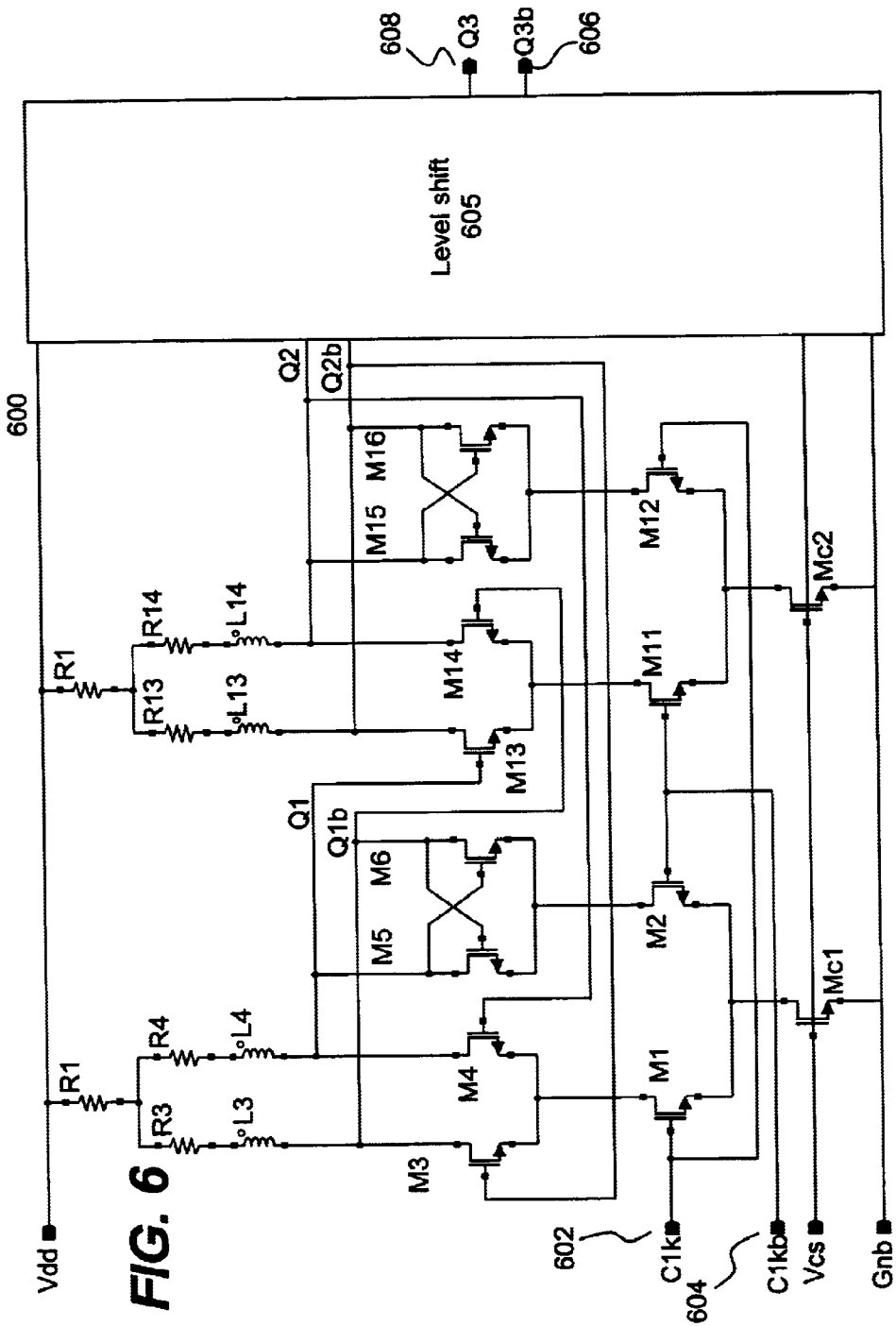
FIG. 6 shows an improved circuit over FIG. 4 that includes the introduced inductors.

At 514, the inductance components are introduced to further adjust the parasitic effects and form more efficient or proper resonant filtering functions to enhance the signal going through the circuit. According to one embodiment, inductors are added and coupled to the respective resistors in series. An exemplary layout of an interwound transformer 540 (including two inductors) as shown in FIG. 5D has an EECP that is also a function of a width W and a length L, wherein, the width W is the width of an elongated strip 542 or 544 and the length L is the total length of the elongated strip 542 or 544. To further utilize the inductors, every pair of two inductors is arranged to form a transformer with a coupling coefficient that is determined by adjusting the arrangement of the two inductors. FIG. 6 shows an improved circuit over FIG. 4 that include the introduced inductors (a pair of which forms a transformer).

To accommodate the high frequency of the signal, the inductive components (e.g., inductors) are respectively adjusted in terms of their respective EECP such that the harmonic components of the output signals can be further minimized. Inherently, the inductances help to reduce some of the parasitic effects and, on the other hand, facilitate the formation of more proper resonant effects to provide better filter functions.

Figure 7A:
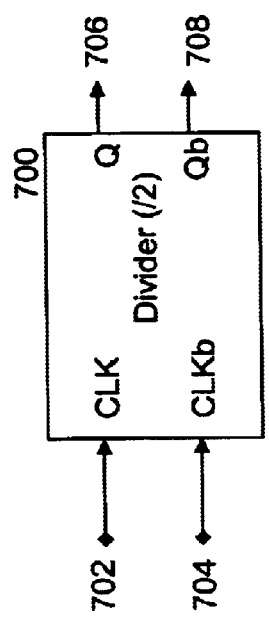
FIG. 7A shows a symbol or representation that includes differential amplifiers designed in accordance with the present invention and can be used as a building block.

Differential amplifiers or circuits designed in accordance with the present invention can accommodate much higher frequency than the differential amplifiers or circuits designed with the prior art methodology. When the differential amplifiers or circuits contemplated in the present invention are used in a system (e.g., a transceiver), it can be appreciated that the system can accommodate very high signal speed. In one application, the differential circuit in FIG. 4 or FIG. 6 including the differential amplifiers designed in accordance with the present invention can be used as a building block 700 as shown in FIG. 7A. In particular, two inputs 702 and 704 correspond respectively to CLK 602 and CLKb 604 of FIG. 6, and two outputs 706 and 708 correspond respectively to Q1 606 and Q1b 608 of FIG. 6. Accordingly, when a pair of differential signals with a frequency F is applied to the inputs 702 and 704, the outputs 706 and 708 will output resultant signals with a frequency F/2.

Figure 7B:
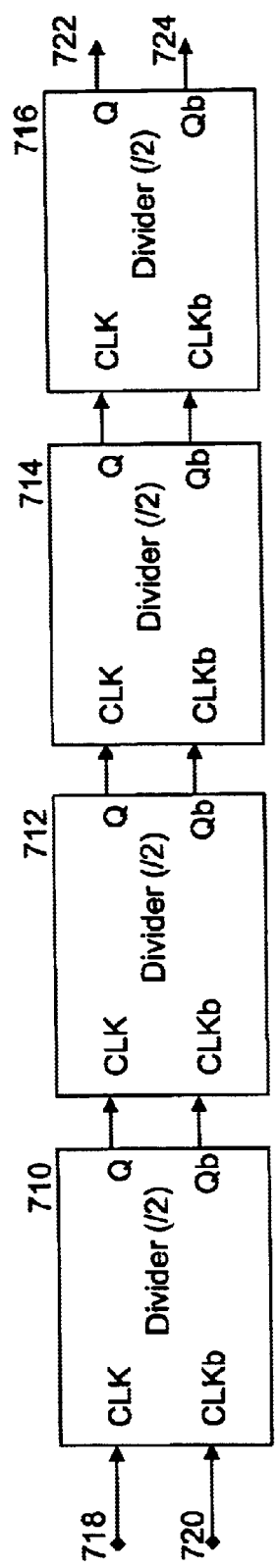
FIG. 7B shows four such building blocks are serially connected to reduce the signal frequency by 16.

FIG. 7B shows four such building blocks are serially connected to reduce the signal frequency by 16. In other words, when a pair of differential signals with a frequency F is applied to the inputs 718 and 720, the outputs 722 and 724 will output resultant signals with a frequency F/16. The following four tables shows respectively the designs of corresponding components using the circuit 600 of FIG. 6 as the building block.

TABLE 1

Designs of EECP for DIVIDER 710 of FIG. 7B

| Component | EECP | Unit | RATIO of EECP |
|---|---|---|---|
| R3 | 25 | Ohm | 1.667 |
| R4 | 25 | Ohm | 1.667 |
| R13 | 15 | Ohm | 1.000 |
| R14 | 15 | Ohm | 1.000 |
| L3 | 250 | Picohenry | 16.667 |
| L4 | 250 | Picohenry | 16.667 |
| L13 | 180 | Picohenry | 12.000 |
| L14 | 180 | Picohenry | 12.000 |
| K34 | 0.5 | dimensionless | 0.033 |
| K134 | 0.5 | dimensionless | 0.033 |
| MC1 | 260 | dimensionless | 17.333 |
| MC11 | 260 | dimensionless | 17.333 |
| M1 | 160 | dimensionless | 10.667 |
| M2 | 160 | dimensionless | 10.667 |
| M11 | 160 | dimensionless | 10.667 |
| M12 | 160 | dimensionless | 10.667 |
| M3 | 120 | dimensionless | 8.000 |
| M4 | 120 | dimensionless | 8.000 |
| M5 | 170 | dimensionless | 11.333 |
| M6 | 170 | dimensionless | 11.333 |
| M13 | 140 | dimensionless | 9.333 |
| M14 | 140 | dimensionless | 9.333 |
| M15 | 170 | dimensionless | 11.333 |
| M16 | 170 | dimensionless | 11.333 |

TABLE

Designs of EECP for DIVIDER 712 of FIG. 7B

| Component | EECP | Unit | RATIO of EECP |
|---|---|---|---|
| R3 | 90 | Ohm | 1.500 |
| R4 | 90 | Ohm | 1.500 |
| R13 | 60 | Ohm | 1.000 |
| R14 | 60 | Ohm | 1.000 |
| L3 | 850 | Picohenry | 14.167 |
| L4 | 850 | Picohenry | 14.167 |
| L13 | 750 | Picohenry | 12.500 |
| L14 | 750 | Picohenry | 12.500 |
| K34 | 0.5 | dimensionless | 0.008 |
| K134 | 0.5 | dimensionless | 0.008 |
| MC1 | 240 | dimensionless | 4.000 |
| MC11 | 240 | dimensionless | 4.000 |
| M1 | 120 | dimensionless | 2.000 |
| M2 | 120 | dimensionless | 2.000 |
| M11 | 120 | dimensionless | 2.000 |
| M12 | 120 | dimensionless | 2.000 |
| M3 | 150 | dimensionless | 2.500 |
| M4 | 150 | dimensionless | 2.500 |
| M5 | 180 | dimensionless | 3.000 |
| M6 | 180 | dimensionless | 3.000 |
| M13 | 140 | dimensionless | 2.333 |
| M14 | 140 | dimensionless | 2.333 |
| M15 | 160 | dimensionless | 2.667 |
| M16 | 160 | dimensionless | 2.667 |

TABLE 3

Designs of EECP for DIVIDER 714 of FIG. 7B

| Component | EECP | Unit | RATIO of EECP |
|---|---|---|---|
| R3 | 200 | Ohm | 0.667 |
| R4 | 200 | Ohm | 0.667 |
| R13 | 300 | Ohm | 1.000 |
| R14 | 300 | Ohm | 1.000 |
| L3 | 0 | Picohenry | 0.000 |
| L4 | 0 | Picohenry | 0.000 |
| L13 | 0 | Picohenry | 0.000 |
| L14 | 0 | Picohenry | 0.000 |
| K34 | 0 | dimensionless | 0.000 |
| K134 | 0 | dimensionless | 0.000 |
| MC1 | 240 | dimensionless | 0.800 |
| MC11 | 240 | dimensionless | 0.800 |
| M1 | 100 | dimensionless | 0.333 |
| M2 | 100 | dimensionless | 0.333 |
| M11 | 100 | dimensionless | 0.333 |
| M12 | 100 | dimensionless | 0.333 |
| M3 | 80 | dimensionless | 0.267 |
| M4 | 80 | dimensionless | 0.267 |
| M5 | 90 | dimensionless | 0.300 |
| M6 | 90 | dimensionless | 0.300 |
| M13 | 80 | dimensionless | 0.267 |
| M14 | 80 | dimensionless | 0.267 |
| M15 | 90 | dimensionless | 0.300 |
| M16 | 90 | dimensionless | 0.300 |

TABLE 4

Designs of EECP for DIVIDER 716 of FIG. 7B

| Component | EECP | Unit | RATIO of EECP |
|---|---|---|---|
| R3 | 250 | Ohm | 1.000 |
| R4 | 250 | Ohm | 1.000 |
| R13 | 250 | Ohm | 1.000 |
| R14 | 250 | Ohm | 1.000 |
| L3 | 0 | Picohenry | 0.000 |
| L4 | 0 | Picohenry | 0.000 |
| L13 | 0 | Picohenry | 0.000 |
| L14 | 0 | Picohenry | 0.000 |
| K34 | 0 | dimensionless | 0.000 |
| K134 | 0 | dimensionless | 0.000 |
| MC1 | 180 | dimensionless | 0.720 |
| MC11 | 180 | dimensionless | 0.720 |
| M1 | 80 | dimensionless | 0.320 |
| M2 | 80 | dimensionless | 0.320 |
| M11 | 80 | dimensionless | 0.320 |
| M12 | 80 | dimensionless | 0.320 |
| M3 | 100 | dimensionless | 0.400 |
| M4 | 100 | dimensionless | 0.400 |
| M5 | 150 | dimensionless | 0.600 |
| M6 | 150 | dimensionless | 0.600 |
| M13 | 100 | dimensionless | 0.400 |
| M14 | 100 | dimensionless | 0.400 |
| M15 | 150 | dimensionless | 0.600 |
| M16 | 150 | dimensionless | 0.600 |

To facilitate the understanding of the present invention and the above tables, some of the components values from Table 1 are listed in the following:

Resistor R3=25 Ohm

Resistor R14=15 Ohm

Inductive component L13=180 Picohenry ($10^{-12}$ henry)

Inductive component L14=180 Picohenry ($10^{-12}$ henry)

K134=coupling coefficient between L13 and L14=0.5 (dimensionless)

Transistor Mc1 has an EECG of 260 (dimensionless)

Transistor M1 has an EECG of 160 (dimensionless)

Thus, the corresponding "RATIO of EECP" is given by:
25:15:180:180:0.5:260:160=
1.667:1.000:12.000:12.000:0.033:17.333:10.667

In arriving at the above RATIO of EECP, a choice of using the EECP of R14 as a common divisor is made. In general, this choice is arbitrary for as long as the resulting RATIO of EECP falls within a convenient range for easy presentation.

It may be observed from the above tables that each of the dividers 710, 712, 714 and 716 has a set of RATIOS and further, one set of RATIOS is different from another set of RATIOS. As used herein, a set of the RATIOS is referred to as a Common Factor (CF), being defined as a ratio matrix or ratio vector (if all ratios are arranged in a column). Accordingly, as one of the features in the present invention, one CF for one divider (e.g., 710) is made different from one CF for another DIVIDER (e.g., 712)

It may be noted that, while there is a general absence of EECP for a capacitive component in the above tables, for those skilled in the art, it should be understood that the adjustment of EECP for numerous capacitive components have already been implicitly included in the present invention. This is due to the presence of inherent capacitance components among the gate, the source, the drain and the bulk of any transistors within a building block and the EECP of these capacitance components would vary according to the adjustment of EEG for each particular transistor under consideration.

FIG. 7A and FIG. 7B are examples of using the circuits employing one or more differential amplifiers designed in accordance with the present invention. Those skilled in the art shall appreciate by now that the present invention can be applied to many other electronic systems that include, may not be limited to, optical communications at 2.5 Gbit/sec (OC48), 10 Gbit/sec (OC192) and 40 Gbit/sec (OC768) data rate, Gigabit Ethernet, 10 Gigabit Ethernet, Blue Tooth technology (2.4 GHz) and wireless LAN (5.2 GHz). With the present invention, the hardware infrastructure for high-speed data processing becomes possible.

Given the description herein, those skilled in the art can appreciate that the methodology of circuit design in the present invention provides solutions of accommodating high signal speed, which is clearly independent of a particular geometry of the wafer process for the fabrication, such as 0.25 μm, 0.18 μm or 0.09 μm. In fact, the methodology of the present invention is naturally scalable with the geometry of the wafer process as it continues its miniaturization process so as to achieve a higher speed of operation.

The present invention has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the foregoing description of embodiment.

We claim:

1. An integrated circuit for high speed signal processing, the integrated circuit comprising:
   a first differential amplifier receiving a set of differential input signals having a frequency,
   a second differential amplifier coupled to the first differential amplifier, each of the first and second differential amplifiers including a number of transistors and resistors, each of the transistors associated with a value of an Electrically Equivalent Geometry (EEG) controlling an electrical current going through the each of the transistors,
   wherein a ratio for each of the transistors is determined to be the EEG of the each of the transistors over the EEG of a chosen one of the transistors, and
   wherein the ratio for each of the transistors is adjusted in reference to the frequency of the input signal so that a first ratio set including the ratio for each of the transistors in the first differential amplifier is different from a second ratio set including the ratio for each of the transistors in the second differential amplifier.

2. The integrated circuit of claim 1, wherein the transistors, after the EEG of each of the transistors is adjusted, create inherently one or more capacitances to reduce parasitic effects that cause artifacts to be introduced to output signals from the second differential amplifier.

3. The integrated circuit of claim 2, wherein the one or more capacitances form respective resonant effects that provide filtering functions to minimize harmonic components in the output signals.

4. The integrated circuit of claim 3, wherein each of the transistors associated with an Electrically Equivalent Component Parameter (EECP), and wherein a ratio for each of the resistors is determined to be the EECP of the each of the resistors over the EECP of a chosen one of the resistors.

5. The integrated circuit of claim 4, wherein the ratio for each of the resistors is adjusted in conjunction of the transistors so that the first ratio set including the ratio for each of the resistors in the first differential amplifier is different from the second ratio set including the ratio for each of the resistors in the second differential amplifier.

6. The integrated circuit of claim 5, wherein the EECP is a function of a width and a length that confine a piece of semiconductor to make one of the resistors.

7. The integrated circuit of claim 3, wherein each of the first and second differential amplifiers further includes at least two inductive components that are arranged to form a transformer with a coupling coefficient, each of the two inductive components associated with an EECP, and wherein respective inductances of the inductive components as well as the coupling coefficient are adjusted by alternating the EECP for each of the two inductive components.

8. The integrated circuit of claim 7, wherein the inductances further reduce the parasitic effects that cause artifacts to be introduced to output signals from the second differential amplifier.

9. The integrated circuit of claim 7, wherein the inductances facilitate to form the respective resonant effects that provide better filtering functions to minimize the harmonic components in the output signals.

10. The integrated circuit of claim 1, wherein, when a physical area of one of the transistors is enlarged as a result of adjusting the correspond EEG, a number of regular transistors are integrated in a layout to form the enlarged transistor.

11. The integrated circuit of claim 1, wherein the transistors in both of the first and second differential amplifiers are CMOS transistors, Bipolar transistors, or Field Effect Transistors.

12. A system for high speed signal processing, the system comprising at least a first building block and a second building block, the first and second building blocks are coupled to provide a desired function, each of the building blocks having identical circuit topology and including:
   a first differential amplifier,
   a second differential amplifier coupled to the first differential amplifier, each of the first and second differential amplifiers including a number of transistors and resistors, each of the transistors associated with a value of an Electrically Equivalent Geometry (EEG) controlling an electrical current going through the each of the transistors, wherein a ratio for each of the transistors is determined to be the EEG of the each of the transistors over the EEG of a chosen one of the transistors, and wherein the ratio for each of the transistors is adjusted to 1) minimize parasitic effects that cause artifacts to output signals, and 2) form resonant effects to provide filtering functions to minimize harmonic components in the output signals.

13. The system of claim 12, wherein a first ratio set including the ratio for each of the transistors in the first differential amplifier is different from a second ratio set including the ratio for each of the transistors in the second differential amplifier.

14. A method for high speed signal processing, the method comprising:

determining a frequency of input signals to be processed by a circuit including at least a first differential amplifier and a second differential amplifier, each of the first and second differential amplifiers including a number of transistors and resistors, each of the transistors associated with a value of an Electrically Equivalent Geometry (EEG) controlling an electrical current going through the each of the transistors;

adjusting the EEG for at least two of the transistors to be minimum without compromising operations of the circuit, wherein the two of the transistors are to receive the input signals; and adjusting systemically the EEG for each of the rest of the transistors such that parasitic effects that cause artifacts to be introduced to output signals and harmonic components in the output signals are minimized.

15. The method of claim 14, wherein a ratio for each of the transistors is determined to be the EEG of the each of the transistors over the EEG of a chosen one of the transistors, and the method further comprising:

determining the ratio for each of the transistors in reference to the frequency of the input signals so that a first ratio set including the ratio for each of the transistors in the first differential amplifier is different from a second ratio set.

16. The method of claim 14, further comprising:

when a physical area of one of the transistors is enlarged as a result of adjusting the correspond EEG, determining a number of regular transistors that can make up the physical area in a layout; and integrating the number of regular transistors to function as an enlarged transistor.

17. The method of claim 16, wherein the harmonic components in the output signals are minimized by filtering functions provided by resonant effects formed largely by parasitic capacitances of the transistors.

18. The method of claim 17, further comprising determining how much inductances that are needed to further reduce the parasitic effects that cause artifacts to be introduced to the output signals and form the resonant effects that can further reduce the harmonic components in the output signals.

* * * * *